United States Patent [19]
Voss et al.

[11] Patent Number: 5,453,950
[45] Date of Patent: Sep. 26, 1995

[54] FIVE TRANSISTOR MEMORY CELL WITH SHARED POWER LINE

[75] Inventors: Peter H. Voss, Watsonville; Jeffrey L. Linden, Aptos, both of Calif.

[73] Assignee: Cypress Semiconductor Corp., San Jose, Calif.

[21] Appl. No.: 377,952

[22] Filed: Jan. 24, 1995

[51] Int. Cl.$^6$ .................................................. G11C 11/40
[52] U.S. Cl. ............................................ 365/156; 365/174
[58] Field of Search ................................ 365/156, 154, 365/174, 189.01

[56] References Cited

U.S. PATENT DOCUMENTS

| | | | |
|---|---|---|---|
| 4,724,530 | 2/1988 | Dingwall | 365/156 |
| 4,872,141 | 10/1989 | Plus et al. | 365/154 |
| 5,301,147 | 4/1994 | Guo et al. | 365/154 |
| 5,315,545 | 5/1994 | Guo et al. | 365/156 |
| 5,353,251 | 10/1994 | Uratani et al. | 365/156 X |

FOREIGN PATENT DOCUMENTS

| 2062391 | 5/1991 | European Pat. Off. | 365/154 |
|---|---|---|---|
| 0026997 | 2/1986 | Japan | 365/154 |

*Primary Examiner*—David C. Nelms
*Assistant Examiner*—Son Dinh
*Attorney, Agent, or Firm*—Blakely, Sokoloff, Taylor & Zafman

[57] ABSTRACT

Static random access memory cells (SRAMS) containing five MOS transistors are configured in a memory array such that only three bitlines are required for two cells. A first bitline is coupled to a first side of a first memory cell, and a second bitline is coupled to a first side of the second memory cell. The first and second memory cells share either a common power bitline or a common ground bitline. A control circuit executes a special write operation to write a low logic level on the second side of the memory cells. The control circuit is coupled to the first, second, and third bitlines to generate a first differential voltage across the memory cells that is lower than the operating voltage on the third bitline and to generate a second voltage lower than the operating voltage on the second bitline when storing a low logic level on the second side of the first storage cell. To perform a special write operation on the second storage cell, the control circuit generates the first differential voltage on the third bitline and the second voltage on the first bitline.

20 Claims, 6 Drawing Sheets

*Figure 4f* ns, and from the detailed description that follows below.

FIVE TRANSISTOR MEMORY CELL WITH SHARED POWER LINE

FIELD OF THE INVENTION

The present invention relates to the field of storing data, and more particularly to storing data in a five transistor static random access memory (SRAM) cell.

BACKGROUND OF THE INVENTION

Integrated circuits utilize metal lines to provide conductivity within the circuit. Typically, memory arrays are constructed with a plurality of metal lines arranged in a number of columns and rows. The column lines are known as bitlines, and the rows lines are know as word lines. As process technology advances, the metal lines become smaller in their pitch (i.e. the distance between the metal lines is decreased). Although a smaller pitch for metal lines in an integrated circuit decreases the size of the circuit, such as the memory array, the decreased pitch introduces other problems. For example, for the memory array, the closer metal bitlines result in increased parasitic coupling between the bitlines. In order to reduce parasitic coupling between bitlines in such memory arrays, it is desirable to reduce the number of metal bitlines required in a memory array.

Figure 1A:
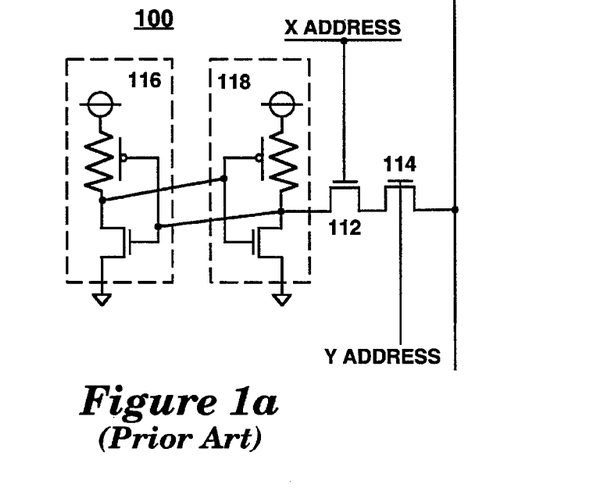
FIG. 1a illustrates a prior art static random access memory (SRAM) cell utilizing a single bit line cross-point cell activation architecture.

FIG. 1a illustrates a prior art static random access memory (SRAM) cell 100 utilizing a single bit line cross-point cell activation architecture. The memory cell 100 contains two cross-coupled inverters coupled to a single bitline 110 via n-channel metal oxide field effect transistors (MOSFETs) 112 and 114. The n-channel transistors 112 and 114 are controlled by an X address and a Y address. The memory cell 100 is constructed of two cross-coupled complimentary metal oxide semiconductor (CMOS) inverters 116 and 118 using a PMOS thin film transistor (TFT) as a load element.

The single bit line cross-point cell activation architecture uses a single bit line that is shared by a neighboring cell (not shown). Because of this, only three metal bitlines are required for two cells. However, because the memory cell 100 contains two stable points, one on each side of inverters 116 and 118, one of the stable points is reached for writing a high logic level to the input of inverter 116 by boosting the voltage of the X and Y wordlines above the operating voltage during the write cycle. A major disadvantage with the memory cell 100 configuration is that the bootstrapping technique, which requires generation of a voltage above the operating voltage, has negative ramifications. For a further explanation of the prior art memory cell 100, see IEEE International Solid State Circuits Conference, session 16, Static Memories, paper FA16.6, entitled, "A Single Bitline Cross-Point Cell Activation (SCPA) Architecture for Ultra Low Powered SRAMs," by Motomu Ukita, et al.

Figure 1B:
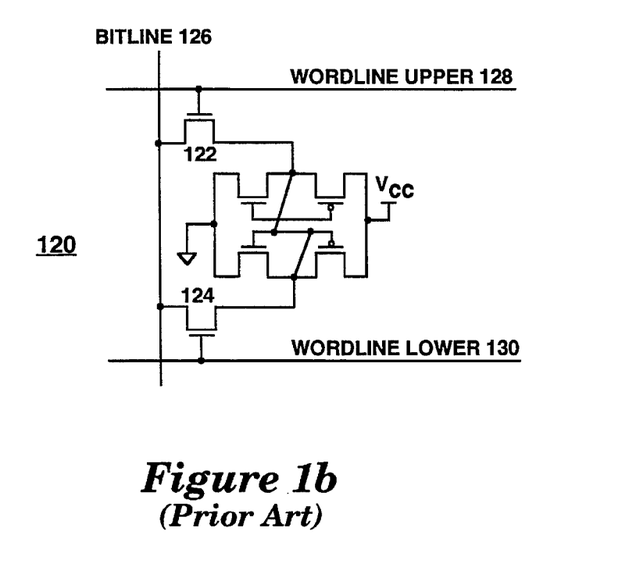
FIG. 1b illustrates a second prior art memory cell that utilizes a single bitline architecture.

FIG. 1b illustrates a second prior art memory cell 120 that utilizes a single bitline architecture. In general, the SRAM cell 120 utilizes the full six transistor memory cell arrangement with thin film transistor (TFT) loads. Included in the six transistor memory cell are pass transistors 122 and 124. The pass transistors 122 and 124 couple both sides of the cell to a single bitline 126. The pass transistor 122 is controlled by an upper wordline 128, and the pass transistor 124 is controlled by a lower wordline 130. Therefore, the memory cell 120 requires separate control of the corresponding pass gates to pulse data into the cell.

Because the SRAM cell 120 is coupled to both the upper wordline 128 and the lower wordline 130 as shown in FIG. 1b, the scheme produces longer than required write pulse widths. Therefore, the prior art SRAM cell 120 sacrifices speed performance for the reduced bitline architecture. Although the memory cell 120 does not use the bootstrapping approach to write to both sides of the cell, a major disadvantage with this architecture is the longer write cycles and the use of six transistors for each cell. For a further explanation of the prior art SRAM cell 120, see the IEEE International Solid State Circuits Conference, 1993, session 16, Static Memories, paper FA 16.5, entitled, "A 16 Mb CMOS SRAM With a 2.3 Micrometer Single-Bit-Line Memory Cell," by Katsuro Sasaki, et al.

SUMMARY AND OBJECTS OF THE INVENTION

Therefore, it is an object of the present invention to reduce the number of metal bitlines required in a memory array.

It is a further object of the present invention to reduce the number of transistors required to implement a static random access memory (SRAM) cell.

It is another object of the present invention to reduce the number of bitlines and the number of transistors per memory cell without boosting the voltage over the operating voltage.

These and other objects of the present invention are realized in a circuit that contains storage cells having two stable points including a first side for storing a first state and a second side for storing a second state opposite the first state. In a memory array, a first data bitline is coupled to the first side of a first storage cell, and a second bitline is coupled to the first side of the second storage cell. Therefore, the storage cells are accessed on one side only. The storage cells are coupled to receive power at an operating voltage, and are coupled to ground. The memory array is configured such that only three bitlines are required for two cells. In a first embodiment for a memory array implementation, two cells share a common power bitline, and in a second embodiment for a memory array implementation, two cells share a common ground bitline.

In a preferred embodiment, the storage cells are static random access memory cells (SRAM) that contain five MOS transistors. In the first memory array embodiment, the third bitline is common power bitline that is coupled to supply power to two memory cells at an operating voltage. In the second memory array embodiment, the third bitline is a common ground bitline that couples two cells to ground.

A control circuit reads and writes to the storage cells. The control circuit executes a special write operation to write a low logic level on the second side of the storage cells. The control circuit is coupled to the first, second, and third bitlines. When storing a low logic level on the second side of the first storage cell, the control circuit generates a first voltage on the third bitline so that the effective operating voltage applied across the first and second storage cells is lower than the operating voltage. The control circuit also generates a second voltage on the second bitline that is lower than the operating voltage. To perform a special write operation on the second storage cell, the control circuit generates the first voltage on the third bitline and the second voltage on the first bitline. In one embodiment, the first voltage is set to one transistor threshold voltage below the operating voltage, and the second voltage is set to a voltage equal to approximately one half the operating voltage.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

DETAILED DESCRIPTION

Figure 2:
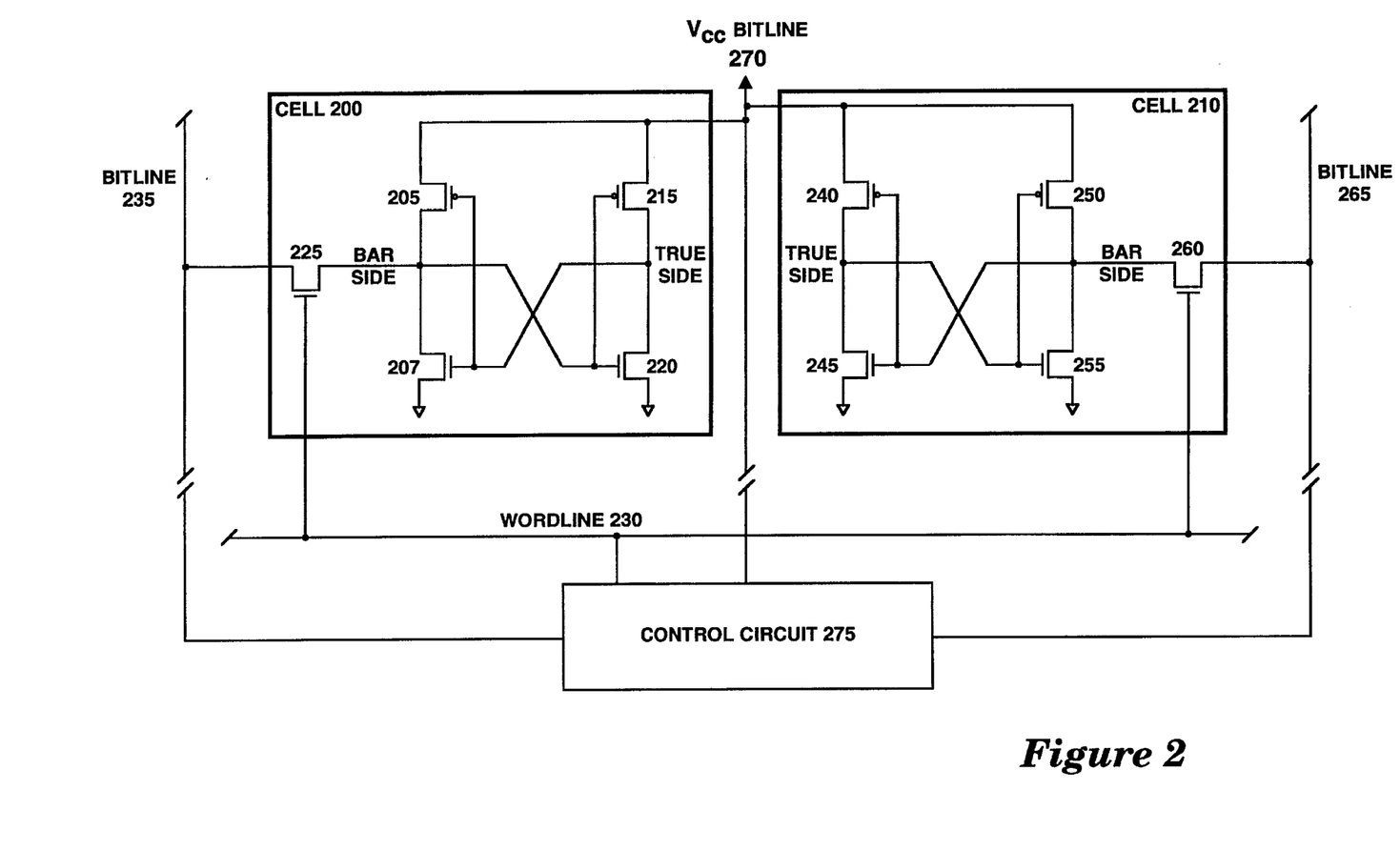
FIG. 2 illustrates two static random access memory (SRAM) cells configured in accordance with a first embodiment of the present invention.

FIG. 2 illustrates two static random access memory (SRAM) cells configured in accordance with a first embodiment of the present invention. Although FIG. 2 illustrates the configuration of two SRAM cells, a plurality of SRAM cells may be configured in an array in accordance with the teachings of the present invention. An array for implementing the five transistor cells of the present invention is described more fully below. Each SRAM cell, such as SRAM cell 200 and SRAM cell 210 shown in FIG. 2, contains five transistors. Specifically, SRAM cell 200 contains a first complimentary metal oxide semiconductor (CMOS) inverter including p-channel transistor 205 and n-channel transistor 207, cross-coupled with a second CMOS inverter including p-channel transistor 215 and n-channel transistor 220. Similarly, SRAM cells 210 also contains two cross-coupled CMOS inverters including p-channel transistors 240 and 250, and n-channel transistors 245 and 255.

The SRAM cells 200 and 210 each include a bar side and a true side that are both stable points for storing two opposite states. As shown on FIG. 2, the true side of SRAM cell 200 is the output of the CMOS inverter containing p-channel transistor 215 and n-channel transistor 220, and the bar side of SRAM 200 is the output of the CMOS inverter containing p-channel transistor 205 and n-channel transistor 207. Similarly, the SRAM cell 210 contains a true side and a bar side as labeled on FIG. 2. The five transistor SRAM cell of the present invention further includes a single pass transistor for each cell, such as n-channel transistor 225 for SRAM cell 200 and n-channel transistor 260 for SRAM cell 210. Consequently, only one side of the SRAM cell is accessed for reading and writing data to the SRAM cell.

Although the preferred embodiment is shown as a five transistor CMOS SRAM cell, other technologies, well known for constructing static RAM cells, may be used without deviating from the spirit and scope of the invention. All that is required to utilize the teachings of the present invention is that the memory cell contain two stable points with only a single access point to one of the stable points.

As shown in FIG. 2, three bit lines are utilized to access the two memory cells 200 and 210. Specifically, a first bit line 235 is coupled to the "bar side" of SRAM cell 200 via the pass transistor 225, and a second bit line 265 is coupled to the bar side of SRAM cell 210 via the pass transistor 260. For the first embodiment, a third bit line, shown as bit line 270 on FIG. 2, couples power to the source terminals of p-channel transistors 205, 215, 240 and 250. The gates of pass transistors 225 and 260 are coupled to a word line 230. As is well known in the art, the word line 230, when activated, selects a particular row of memory cells in a memory array. The bitlines 235, 265, and 270 and the wordline 230 is coupled to a control circuit 275. In general, the control circuit 275 permits reading and writing to the SRAM cells 200 and 210 through control of the bitlines 235, 265, and 270 and the wordline 230.

As is illustrated in FIG. 2, the static RAM configuration of the present invention substantially reduces the number of bit lines required for a memory array (e.g. only three bitlines are required for two memory cells). As discussed above, as technology advances, metal lines on integrated circuit devices have smaller pitches. With use of the present invention, the number of metal lines required in the column pitch for two SRAM cells is reduced from four lines to three lines. The three-column pitch for the two memory cell configuration is an advantage in both yield and in reducing the parasitic coupling between bit lines. For example, in a four-column pitch configuration, the additional bit line necessitates that the bit lines are located closer to one another.

In order to read from the five transistor cell configuration of the present invention, such as SRAM cells 200 and 210, a common reference line technique is utilized. For example, in order to read the state of static RAM cell 200, the control circuit 275 generates an active high logic level on the wordline 230 to bias the gate of the n-channel transistor 225 (pass transistor), thereby providing an electrical path from the bar side of SRAM 200 to the bitline 235. The state on bitline 235 is compared with a state sensed from a dummy reference cell. Note that in the preferred embodiment the "bar side" of the SRAM cell is sensed, and therefore reverse logic is used to generate an output indicating the true state of the cell.

In order to write a high logic level to the true side of SRAM cells 200 and 210, a normal SRAM write operation may be executed. For example, to write a high logic level to the true side of SRAM cell 200, the control circuit 275 charges the wordline 230 to bias the pass transistors 225 and 260, thereby electrically coupling the bar sides of SRAM cells 200 and 210 to the respective bitlines 235 and 265. The control circuit 275 generates a low logic level on the bitline 235, such that the low logic level is input to the SRAM cell 200 on the bar side. The low logic level input to the bar side of the SRAM cell 200 results in biasing the n-channel transistor 220 to turn off and the p-channel transistor 215 to turn on. This operation results in a high logic level being generated on the true side of SRAM cell 200.

Although the normal SRAM write operation may be utilized to write a high logic level to the true side of the SRAM cells through use of only a single access point on the bar side of the cell, a special write operation is required to drive the true side of the five transistor SRAM cell configuration to a low logic level (i.e. because the true side of the five transistor SRAM cell configuration of the present invention is not coupled to a pass gate). In a preferred embodiment, to write a low logic level to the true side of SRAM cell 200, the wordline 230 is driven to an active high logic level similar to a normal write operation. In addition, the control circuit 275 generates a first voltage level on the bitline 270 that is below the operating voltage, $V_{cc}$, and drives the bitline 265 for the SRAM cell 210 to a second voltage level that is also less than the operating voltage, $V_{cc}$. Also, to complete the special write operation to the SRAM cell 200, the control circuit 275 drives the bitline 235 to a high logic level for input to the SRAM 200 on the bar side.

In one embodiment, for the special write operation to the SRAM cell 200, the voltage on the bitline 265 is set to approximately one half of the operating voltage (e.g. $V_{cc}/2$), and the voltage on the bitline 270 is set to a voltage approximately equal to $V_{cc}$ minus a threshold voltage of the MOS transistors. With the reduction of operating voltage $V_{cc}$ on the SRAM cell 200, the true side of SRAM cell 200 is driven to a low logic level without the need of an additional pass transistor coupled to the true side of the cell. Because SRAM cell 200 and SRAM cell 210 share a common $V_{cc}$ bitline 270, the lowering of the operating voltage $V_{cc}$ affects both the SRAM cells 200 and 210. Therefore, the control circuit 275 drives the bitline 265 to the second voltage level to retain the state currently stored in the SRAM cell 210. Therefore, the SRAM cell 210 is not affected by the special write operation to the SRAM cell 200.

The special write operation to the SRAM cell 210 is similar except that the operation on the bitlines 235 and 265 is reversed. In order to write a high logic level to the true side of SRAM cell 210, the voltage on the bitline 270 is set to the first voltage level, the voltage on bitline 235 is set to the second voltage level, and the voltage on the bitline 265 is set to a high logic level. The state of SRAM cell 200 is not affected by the write to SRAM cell 210.

As described above, the memory cells 200 and 210 illustrated in FIG. 2 are coupled to a first data bitline 235, a second data bitline 265, and a $V_{cc}$ bitline 270. An additional ground or $V_{ss}$ bitline may be provided to couple n channel transistors 210 and 220 in the memory cell 200 and n channel transistors 245 and 255 in the memory cell 210 to ground. For the additional $V_{ss}$ bitline configuration, two memory cells share a common $V_{ss}$ bitline. Memory cells in an array that are positioned as the first or last cell in a row are coupled to a half a $V_{ss}$ bitline. As an alternative embodiment to the additional $V_{ss}$ bitline configuration, the n channel transistors 210 and 220 in the memory cell 200 and n channel transistors 245 and 255 in the memory cell 210 are coupled to ground via a poly silicon connection formed as a row across the memory cells.

Figure 3:
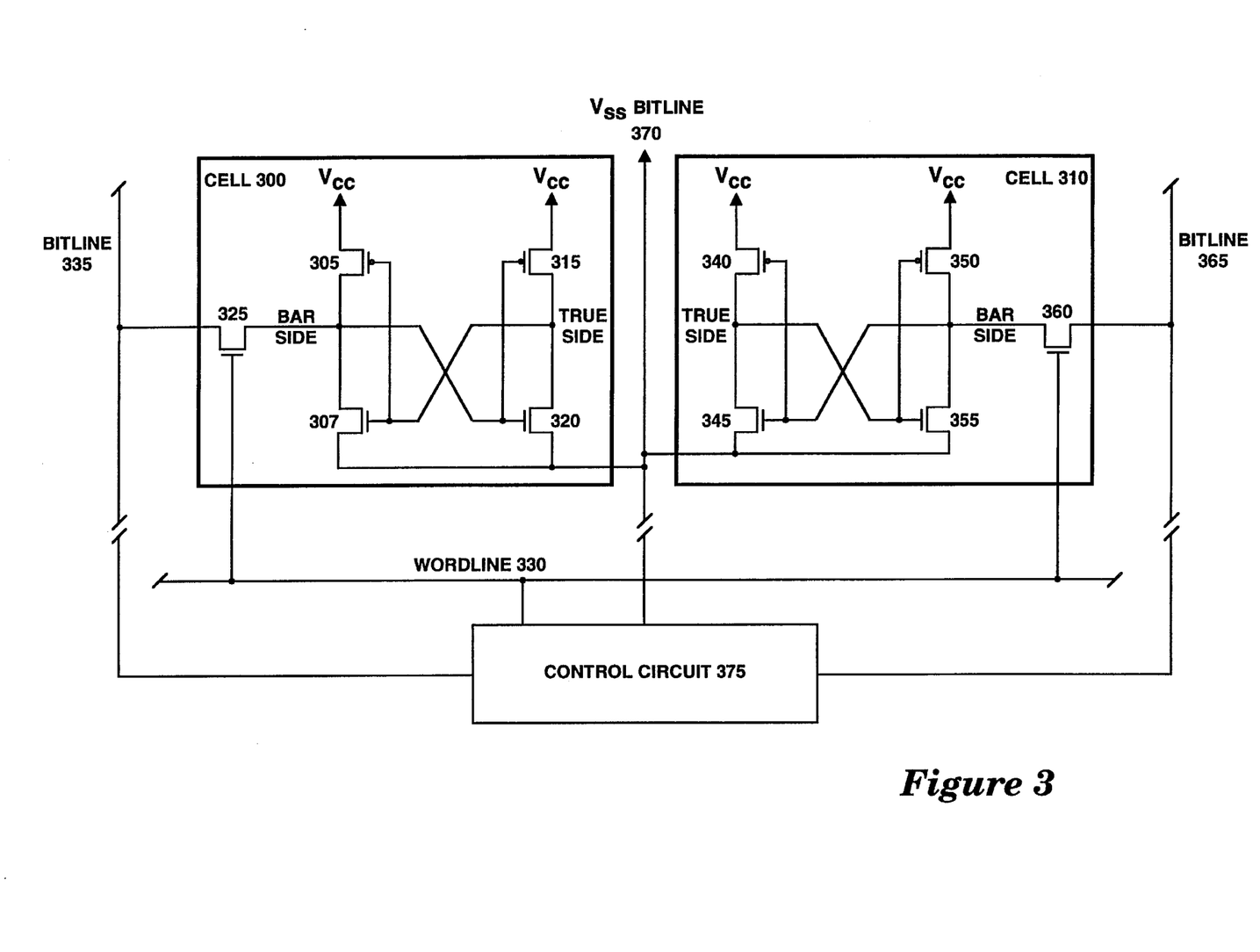
FIG. 3 illustrates two static random access memory (SRAM) cells configured in accordance with a second embodiment of the present invention.

FIG. 3 illustrates two static random access memory (SRAM) cells configured in accordance with a second embodiment of the present invention. The second embodiment illustrated in FIG. 3 is configured similar to the first embodiment illustrated in FIG. 1 except that the third bitline 370 is a ground or $V_{ss}$ bitline. The $V_{ss}$ bitline 370 is common to memory cells 300 and 310 such that the $V_{ss}$ bitline 370 is coupled to the source of n channel transistors 307 and 320 in cell 300 and to the source of n channel transistors 345 and 355 in cell 310.

For the special write operation to the SRAM cell 300, the voltage on the bitline 365 is set to approximately one half of the operating voltage (e.g. $V_{cc}/2$), and the voltage on the $V_{ss}$ bitline 370 is set to a voltage approximately equal to a threshold voltage of the MOS transistors. By generating a first voltage on the $V_{ss}$ bitline 370, the true side of SRAM cell 300 is driven to a low logic level without the need of an additional pass transistor coupled to the true side of the cell. Because SRAM cell 300 and SRAM cell 310 share a common $V_{ss}$ bitline 370, the generation of the first voltage on the $V_{ss}$ bitline 370 affects both the SRAM cells 300 and 310. Therefore, the control circuit 375 drives the bitline 365 to the second voltage level to retain the state currently stored in the SRAM cell 310. Accordingly, the SRAM cell 310 is not affected by the special write operation to the SRAM cell 300.

The special write operation to the SRAM cell 310 is similar except that the operation on the bitlines 335 and 365 is reversed. In order to write a high logic level to the true side of SRAM cell 310, the voltage on the $V_{ss}$ bitline 370 is set to the first voltage level, the voltage on bitline 335 is set to the second voltage level, and the voltage on the bitline 365 is set to a high logic level. The state of SRAM cell 300 is not affected by the write to SRAM cell 310.

Figure 4A:
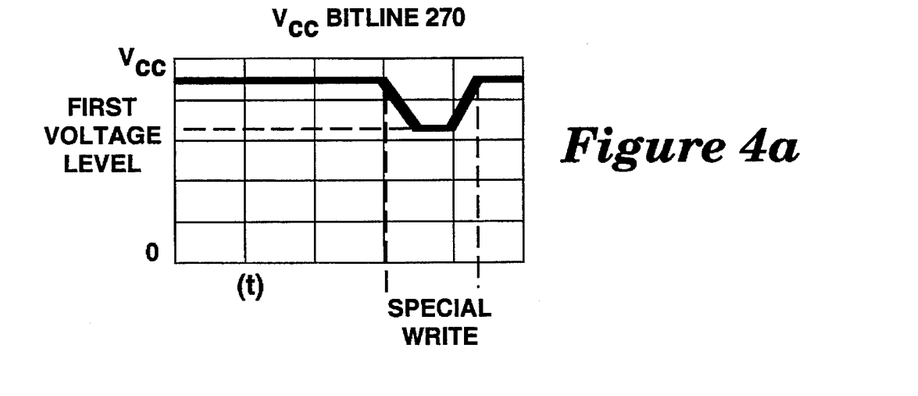
FIGS. 4a-f illustrate one embodiment of voltage waveforms for the special write operation to the SRAM cell of the present invention.
Figure 4B:
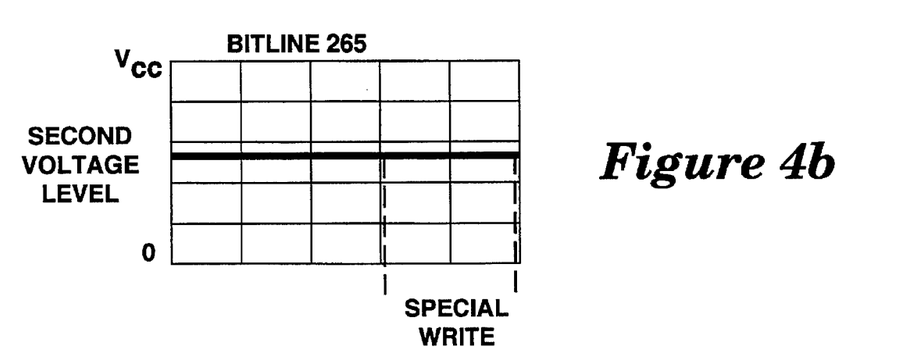
Figure 4C:
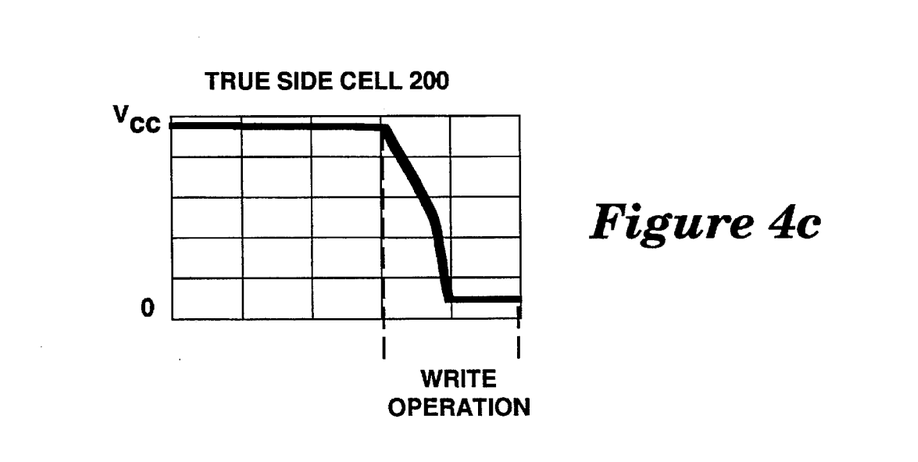
Figure 4D:
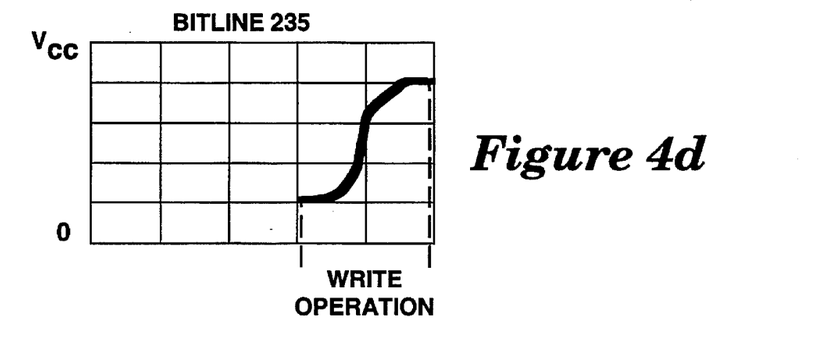
Figure 4E:
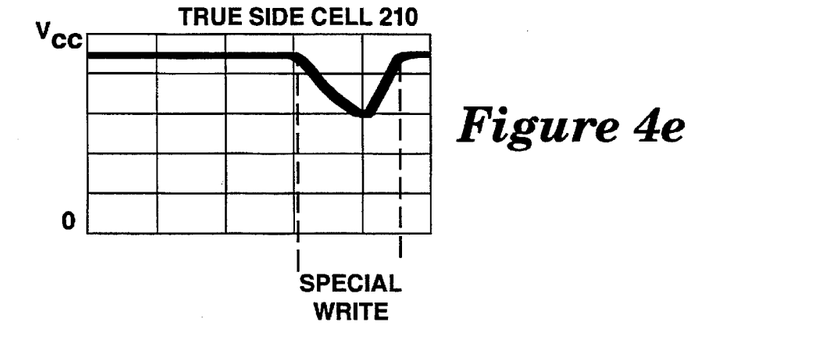
Figure 4F:
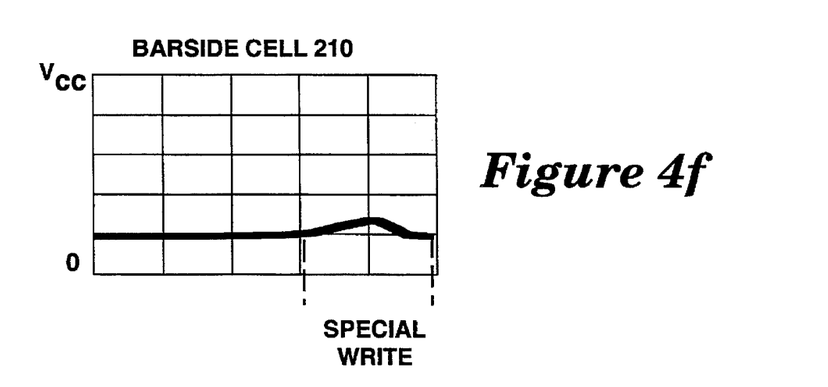

FIGS. 4a–f illustrate one embodiment of voltage waveforms for the special write operation to the SRAM cell 200. FIG. 4a shows the lowering of the voltage on the $V_{cc}$ bitline 270 to the first voltage level, and FIG. 4b shows the generation of the second voltage level on the bitline 265 for the special write operation to the SRAM cell 200. FIG. 4c illustrates the voltage waveform for the true side of the SRAM cell 200 for the special write operation when the SRAM cell 200 previously stored a high logic level. FIG. 4d illustrates the voltage waveform driven on the bitline 235 to write a low logic level to the true side of the SRAM 200. FIGS. 4e and 4f illustrate the voltage level of the true and bar sides, respectively, of the SRAM cell 210 during the special write operation when the SRAM cell 210 previously stored a high logic level.

Figure 5:
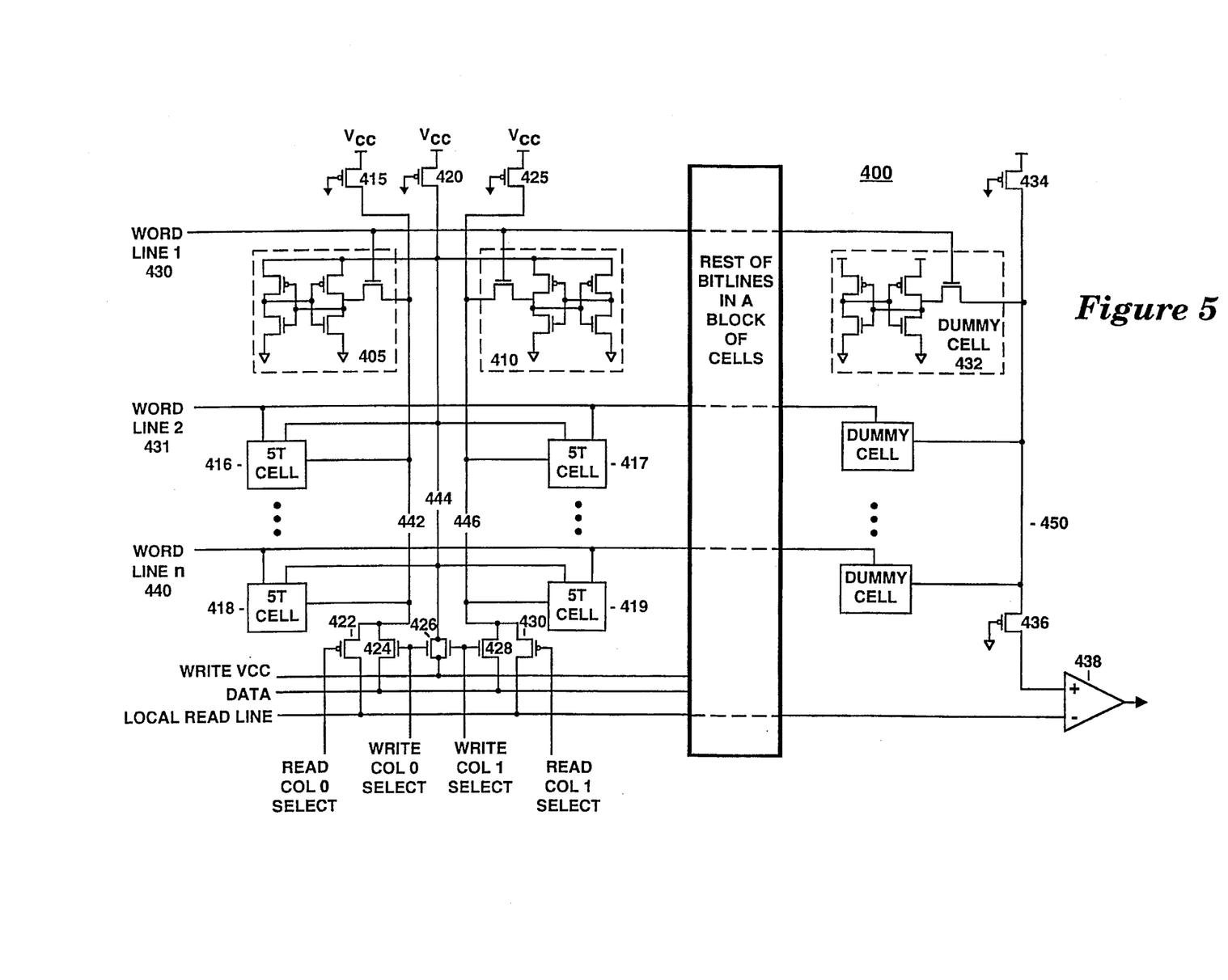
FIG. 5 illustrates a memory array configured in accordance with one embodiment of the present invention.

FIG. 5 illustrates a memory array configured in accordance with one embodiment of the present invention. The memory array 400 includes a plurality of SRAM cells labeled 405, 410, 416, 417, 418 and 419 on FIG. 5. For the embodiment of FIG. 5, the SRAM cells include the five transistor SRAM cell configuration of the present invention. The preferred embodiment for the five transistor cell is shown in SRAM cells 405 and 410. However, for simplicity, the remaining SRAM cells 416, 417, 418 and 419 are shown and labeled "5T Cell." The array 400 is arranged in a plurality of rows and columns. Specifically, the array 400 contains "n" rows that are each accessible by a corresponding wordline, 1–n. For example, wordline "1" 430 selects a first row in the memory array 400, wordline "2" 431 is used to select a second row, and wordline 440 "n" is used to select the nth row of SRAM cells. In general, the memory array 400 is arranged in a plurality of columns such that three bitlines are used for two neighboring cells. The memory array 400 may contain any number of columns that are arranged as the first two columns (e.g. the first column contains SRAM cells 405, 416, and 418, and the second column contains SRAM cells 410, 417, and 419). For simplicity, only two columns of SRAM cells are shown. In order to sense the memory cells, the memory array 400 further includes a column of dummy reference cells, including dummy reference cell 432.

The SRAM cell 405 is coupled to a first bitline labeled 442 on FIG. 5. As explained above in conjunction with a discussion of FIG. 2, the SRAM cell 405 is coupled at the "bar side" of the cell through a pass transistor. The SRAM cell 410 is coupled to a second bitline 446 on the "bar side" of the cell. The SRAM cells 405 and 410 share a common $V_{cc}$ bitline labeled 444 on FIG. 5.

In one embodiment, the control circuit 275 (FIG. 2) for the memory array 400 is configured with a plurality of MOS transistors (422, 424, 426, 428, 430) a write $V_{cc}$ line, a data line, a local read line, a read column 0 select, a read column 1 select, a write column 0 select, a write column 1 select. The state of these lines to perform a read and write operation is described below; however the generation of these signals in the memory array 400 is not shown so as to not obscure the invention. The MOS transistors (422, 424, 426, 428, 430) are required for each two columns of memory cells.

The bitline 442 is coupled to the local read line via a p-channel transistor 422, and is coupled to the data line via a n-channel transistor 424. The p-channel transistor 422 is controlled by the read column 0 select signal, and the n-channel transistor 424 is controlled by the write column 0 select signal. The $V_{cc}$ bitline 444 is coupled to the write $V_{cc}$ line via a transmission gate 426, having two n-channel transistors. The transmission gate 426 is controlled by the write column 0 select and the write column 1 select signals. The control circuitry for the memory array 400 also contains a n-channel transistor 428 that couples the bitline 446 to the data line, and a p-channel 430 that couples the bitline 446 to the local read line.

In general, the write $V_{cc}$ line permits lowering the operating voltage on the $V_{cc}$ bitline 444 for the special write operation. The data line receives input data to be written to one of two of the cells in the corresponding columns. The local read line is utilized to sense the state of the SRAM cells with a common reference line technique. Each bitline further includes a column load transistor (e.g. bitline 442 contains p-channel transistor 415, bitline 444 contains p-channel transistor 420, and bitline 446 contains p-channel transistor 425).

In operation, in order to write a low logic level to SRAM cell 405, the write column 0 select signal is an active high logic level, and the write column 1 select signal is an inactive low logic level. In addition, the data line is pulled to a low logic level, and the write $V_{cc}$ line is held at the operating voltage, $V_{cc}$. In addition, the wordline "1" 430 is activated to bias the SRAM cell 405 pass transistor to conduct from the bitline 442 into the bar side of SRAM cell 405. By generating an active high logic level signal on the write column 0 select line, the n-channel transistor 424 is biased to conduct current from the data line to the bitline 442, and the transmission gate 426 is biased to couple the $V_{cc}$ bitline 444 to the write $V_{cc}$ line. Because the write column 1 select line is set at an inactive low logic level, the bitline 446 is not coupled to the data line and the SRAM cell 410 is not affected.

To execute the special write operation of writing a high logic level to the SRAM cell 405, the write column 0 select line is set at an inactive low logic level, the write column 1 select line is set to an active high logic level, and both data and write $V_{cc}$ lines are set to an intermediate voltage (e.g. data line is set to half the $V_{cc}$ voltage, and write $V_{cc}$ is set to approximately $V_{cc}$ minus one threshold voltage). The intermediate voltage is generated on the bitline 444 by sizing the n-channel transistors in the transmission gate 426. The sizing of transistors to generate a voltage drop is well known in the art. The low logic level on the write column 0 select line turns off n-channel transistor 424, thereby permitting bitline 442 to be pulled to a high logic level through the load transistor 415 and $V_{cc}$. The high logic level on the write column 1 select line biases the transmission gate 426 to couple the $V_{cc}$ bitline 444 to the write $V_{cc}$ line, and biases n-channel transistor 428 to couple the bitline 446 to the data line. By placing the intermediate voltage on the data line, the SRAM cell 410 retains the state held prior to the write operation to the SRAM cell 405.

A write operation to the SRAM cell 410 is analogous to a write operation to SRAM cell 405 except that the write column selects are reversed. Specifically, to write a high logic level to SRAM cell 410, the write column 0 select line is set to a high logic level, the write column 1 select line is set to a low logic level, and data and write $V_{cc}$ lines are set at their intermediate voltages. In order to write a low logic level to SRAM cell 410, the write column 0 select line is driven to a low logic level, and the write column 1 select line is driven to a high logic level, the data line is set to a low logic level, and the write $V_{cc}$ line is set at $V_{cc}$.

The SRAM cells in both columns (e.g. column one and column two) are read through the local read line. For a read operation, the read column 0 select and read column 1 select lines are activated to electrically couple the corresponding bit lines to the local read line. For example, to read the state of SRAM cell 410, the read column 1 select line is set to an active low logic level to bias p-channel transistor 430 to couple the bitline 446 to the local read line. As shown in FIG. 5, the local read line is coupled to a sense amplifier 438 on the negative differential input. The sense amplifier 438 is coupled to the dummy bitline 450. When executing a read operation, the appropriate word line is activated to bias the pass transistor in the dummy cell to generate the high logic level on bitline 450. The appropriate threshold drops are generated on bitline 450 through use of the p-channel transistors 434 and 436.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A circuit for storing data comprising:

first and second storage elements having two stable points including a first side for storing a first state and a second side for storing a second state opposite said first state;

a first bitline coupled to said first side of said first storage element;

a second bitline coupled to said first side of said second storage element;

a third bitline coupled to said first and second storage elements to control an operating voltage supplied across said first and second storage elements; and a control circuit coupled to said first, second and third bitlines for generating a first voltage across said first storage element via said third bitline that is lower than said operating voltage and for generating a second voltage lower than said operating voltage on said second bitline when storing a low logic level on said second side of said first storage element, and for generating said first voltage across said second storage element and said second voltage on said first bitline when storing a low logic level on said second side of said second storage element.

2. The circuit as set forth in claim 1, wherein:

said third bitline comprises a $V_{cc}$ bitline for supplying power to said first and second storage elements; and said control circuit for generating a first voltage across said first storage element generates a voltage lower than said operating voltage on said $V_{cc}$ bitline.

3. The circuit as set forth in claim 1, wherein:

said third bitline comprises a $V_{ss}$ bitline to ground said first and second storage elements; and said control circuit for generating a first voltage across said first storage element generates a voltage higher than ground on said $V_{ss}$ bitline.

4. The circuit as set forth in claim 1, wherein:

said first storage element comprises a five transistor static random access memory (SRAM) cell including a first pair of cross coupled inverters and a first pass transistor coupled to said first side of said first storage element; and said second storage element comprises a five transistor SRAM cell including a second pair of cross coupled inverters and a second pass transistor coupled to said first side of said second storage element.

5. The circuit as set forth in claim 4, wherein:

said first SRAM cell comprises a first pair of cross coupled complementary metal oxide semiconductor (CMOS) inverters and a first pass transistor coupled to said first side of said first storage element, such that the output of a first CMOS inverter is coupled to the input of a second CMOS inverter and the output of a first CMOS inverter is coupled to the input of a second CMOS inverter; and said second SRAM cell comprises a second pair of cross coupled CMOS inverters and a second pass transistor coupled to said first side of said second storage element, such that the output of a first CMOS inverter is coupled to the input of a second CMOS inverter and the output of a first CMOS inverter is coupled to the input of a second CMOS inverter.

6. The circuit as set forth in claim 1, wherein said first differential voltage comprises one transistor threshold voltage less than said operating voltage.

7. The circuit as set forth in claim 1, wherein said second voltage comprises a voltage equal to approximately one half said operating voltage.

8. The circuit as set forth in claim 1, wherein said control circuit comprises:

a first resistive element coupled to said second data bitline for generating said second voltage when storing a low logic level on said second side of said first storage element; and a second resistive element coupled to said first data bitline for generating said second voltage when storing a low logic level on said second side of said second storage element.

9. A method for storing data comprising the steps of:

providing a plurality of storage elements each having two stable points, wherein a first side of a storage element stores a first state and a second side stores a second state opposite said first state;

coupling a first bitline to said first side of a first storage element;

coupling a second bitline to said first side of a second storage element;

coupling a third bitline to said first and second storage elements to control an operating voltage supplied across said first and second storage elements;

storing a low logic level on said Second side of said first storage element comprising the steps of:

generating a first voltage across said first storage element via said third bitline that is lower than said operating voltage; and generating a second voltage lower than said operating voltage on said second bitline;

storing a low logic level on said second side of said second storage element comprising the steps of:

generating said first voltage across said second storage element via said third bitline; and generating said second voltage on said first bitline.

10. The method as set forth in claim 9, wherein:

the step of coupling a third bitline to said first and second storage elements comprises the step of coupling a $V_{cc}$ bitline to supply power to said first and second storage elements; and the step of generating a first voltage across said first storage element via said third bitline comprises the step of generating a voltage lower than said operating voltage on said $V_{cc}$ bitline.

11. The method as set forth in claim 9, wherein:

the step of coupling a third bitline to said first and second storage elements comprises the step of coupling a $V_{ss}$ bitline to ground said first and second storage elements; and the step of generating a first voltage across said first storage element via said third bitline comprises the step of generating a voltage a voltage higher than ground on said $V_{ss}$ bitline.

12. The method as set forth in claim 9, wherein the step of providing a plurality of storage elements comprises the steps of:

providing a five transistor static random access memory (SRAM) cell for said first storage element including a first pair of cross coupled inverters and a first pass transistor coupled to said first side of said first storage element; and providing a five transistor static random access memory (SRAM) cell for said second storage element including a second pair of cross coupled inverters and a second pass transistor coupled to said first side of said second storage element.

13. The method as set forth in claim 12, wherein:

said first SRAM cell comprises a first pair of cross coupled complementary metal oxide semiconductor (CMOS) inverters and a first pass transistor coupled to said first side of said first storage element, such that the output of a first CMOS inverter is coupled to the input of a second CMOS inverter and the output of a first CMOS inverter is coupled to the input of a second CMOS inverter; and said second SRAM cell comprises a second pair of cross coupled CMOS inverters and a second pass transistor coupled to said first side of said second storage element, such that the output of a first CMOS inverter is coupled to the input of a second CMOS inverter and the output of a first CMOS inverter is coupled to the input of a second CMOS inverter.

14. The method as set forth in claim 9, wherein the step of generating a first voltage across said first storage element via said third bitline comprises the step of generating a voltage substantially equal to one transistor threshold voltage less than said operating voltage.

15. The method as set forth in claim 1, wherein the step of generating a second voltage lower than said operating voltage comprises the step of generating a voltage equal to approximately one half said operating voltage.

16. A memory array comprising:

a plurality of storage elements arranged in a plurality of rows and columns such that two adjacent columns of storage elements comprise a group, wherein each storage element comprises two stable points including a first side for storing a first state and a second side for storing a second state opposite said first state;

a plurality of first column bitlines coupled to said first side of each first storage element in a corresponding group;

a plurality of second column bitlines coupled to said first side of each second storage element in a corresponding group;

a plurality of third column bitlines coupled to said first and second storage elements in a corresponding group to control an operating voltage supplied across said first and second storage elements for said corresponding group; and a control circuit coupled to said first, second and third bitlines of each group that generates a first voltage across said first storage element of a group via a corresponding third column bitline that is lower than said operating voltage, and that generates a second voltage lower than said operating voltage on said second bitline when storing a low logic level on said second side of said first storage element, and that generates said first voltage across said second storage element and said second voltage on said first bitline when storing a low logic level on said second side of said second storage element.

17. The memory array as set forth in claim 16, wherein:

said third column bitline comprises a $V_{cc}$ bitline for supplying power to said first and second storage elements; and said control circuit for generating a first voltage across said first storage element generates a voltage lower than said operating voltage on said $V_{cc}$ bitline.

18. The memory array as set forth in claim 16, wherein:

said third bitline comprises a $V_{ss}$ bitline to ground said first and second storage elements; and said control circuit for generating a first voltage across said first storage element generates a voltage higher than ground on said $V_{ss}$ bitline.

19. The memory array as set forth in claim 16, wherein said control circuit comprises:

a write voltage line;

a data line;

first and second write column select lines for each group;

a plurality of first write switches coupling said data line to each first column bitline and being controlled by said first write column select line;

a plurality of second write switches coupling said data line to each second column bitline and being controlled by said second write column select line; and a plurality of transmission gates coupling said write voltage line to each third column bitline and being controlled by said first and second write column select lines.

20. The memory array as set forth in claim 16, wherein said control circuit comprises:

a local read line;

first and second read column select lines for each group;

a plurality of first read switches coupling said local read line to said first column bitline and being controlled by said first read column select line; and a plurality of second read switches coupling said local read line to said second column bitline and being controlled by said second read column select line.

* * * * *

UNITED STATES PATENT AND TRADEMARK OFFICE
CERTIFICATE OF CORRECTION

PATENT NO. : 5,453,950             Page 1 of 3
DATED : September 26, 1995
INVENTOR(S) : Peter H. Voss et al.

It is certified that error appears in the above-indentified patent and that said Letters Patent is hereby corrected as shown below:

IN THE ABSTRACT

In the Abstract, line 1, please delete "cells (SRAMS)" and insert --(SRAM) cells-- in place thereof.

In the Abstract, line 5, please delete "the second " and insert --a second-- in place thereof.

On column 1, line 57, please delete "the" and insert --a-- in place thereof.

On column 1, line 61, please delete "The pass" and insert --Pass-- in place thereof.

On column 2, line 41, please delete "cells (SRAM)" and insert --(SRAM) cells-- in place thereof.

On column 3, line 8, please delete "bit line" and insert --bit-line-- in place thereof.

On column 3, line 40, please delete "cells" and insert --cell-- in place thereof.

UNITED STATES PATENT AND TRADEMARK OFFICE
CERTIFICATE OF CORRECTION

PATENT NO. : 5,453,950
DATED : September 26, 1995
INVENTOR(S) : Peter H. Voss et al.

It is certified that error appears in the above-indentified patent and that said Letters Patent is hereby corrected as shown below:

On column 3, line 66, please delete "the two".

On column 4, line 11, please delete "is" and insert --are-- in place thereof.

On column 5, line 36, please delete "n channel" and insert --n-channel-- in place thereof.

On column 5, lines 37-38, please delete "n channel" and insert --n-channel-- in place thereof.

On column 5, lines 43-44, please delete "n channel" and insert --n-channel-- in place thereof.

On column 5, lines 44-45, please delete "n channel" and insert --n-channel-- in place thereof.

On column 5, line 46, please delete "poly silicon" and insert "polysilicon" in place thereof.

On column 5, line 55, please delete "n channel" and insert --n-channel-- in place thereof.

On column 5, line 56, please delete "n channel" and insert --n-channel-- in place thereof.

UNITED STATES PATENT AND TRADEMARK OFFICE
CERTIFICATE OF CORRECTION

PATENT NO. : 5,453,950
DATED : September 26, 1995
INVENTOR(S) : Peter H. Voss et al.

It is certified that error appears in the above-indentified patent and that said Letters Patent is hereby corrected as shown below:

On column 6, line 45, please delete '440 "n"' and insert --"n" 440-- in place thereof.

Column 6, line 67, please insert --,-- after "430)".

On column 7, line 2, please delete "," after "0 select," and insert --and-- after "0 select".

On column 7, line 4, please insert --,-- after "however".

On column 9, line 32, please delete "differential".

On column 10, line 59, please delete "1" and insert --9--.

Signed and Sealed this

Twenty-first Day of May, 1996

Attest:

BRUCE LEHMAN

*Attesting Officer*     Commissioner of Patents and Trademarks